United States Patent
Chandrasekhar et al.

(10) Patent No.: US 7,903,461 B2
(45) Date of Patent: Mar. 8, 2011

(54) SENSING FOR MEMORY READ AND PROGRAM VERIFY OPERATIONS IN A NON-VOLATILE MEMORY DEVICE

(75) Inventors: Uday Chandrasekhar, San Jose, CA (US); Ebrahim Abedifard, Sunnyvale, CA (US); Allahyar Vahidimowlavi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 236 days.

(21) Appl. No.: 12/235,254

(22) Filed: Sep. 22, 2008

(65) Prior Publication Data

US 2010/0074015 A1 Mar. 25, 2010

(51) Int. Cl.
*G11C 16/06* (2006.01)
(52) U.S. Cl. .......... 365/185.17; 365/185.25; 365/185.03; 365/185.26; 365/185.24; 365/189.02
(58) Field of Classification Search ............. 365/185.17, 365/185.22, 185.03, 185.26, 185.21, 189.02
See application file for complete search history.

(56) References Cited

U.S. PATENT DOCUMENTS

| | | | |
|---|---|---|---|
| 6,262,916 B1 | 7/2001 | Kuriyama et al. | |
| 6,370,061 B1 | 4/2002 | Yachareni et al. | |
| 6,970,382 B2 | 11/2005 | Toros et al. | |
| 2005/0254302 A1* | 11/2005 | Noguchi | 365/185.17 |

* cited by examiner

*Primary Examiner* — Thong Q Le
(74) *Attorney, Agent, or Firm* — Leffert Jay & Polglaze, P.A.

(57) ABSTRACT

Methods for sensing in a memory device, a memory device, and a memory system are disclosed. In one such sensing method, a single read operation with multiple sense amplifier circuit comparisons to a reference threshold level are performed to determine a state of a selected memory cell. A ramped voltage turns on the selected memory cell when the ramped voltage reaches the threshold voltage to which the selected memory cell is programmed. In one embodiment, the turned on memory cell discharges its respective bit line.

31 Claims, 8 Drawing Sheets

US 7,903,461 B2

SENSING FOR MEMORY READ AND PROGRAM VERIFY OPERATIONS IN A NON-VOLATILE MEMORY DEVICE

TECHNICAL FIELD OF THE INVENTION

The present invention relates generally to memory devices and in a particular embodiment the present invention relates to non-volatile memory devices.

BACKGROUND OF THE INVENTION

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A typical read operation, also referred to as a sense operation, is comprised of grounding the source line of the memory block to be read, precharging the memory block data lines (e.g., bit lines), and biasing the access lines (e.g., word lines) in order to turn on all of the word lines except the word line to be read. A read voltage is then applied to the word line to be read and the select gates of alternate bit lines are turned on. If the bit line becomes discharged, the threshold voltage of the cell being read is less than the word line voltage. In this case, the cell is erased and is in a logical 1 state. If the bit line remains precharged, the threshold voltage of the cell being read is greater than the word line voltage that was applied to the word line being read. In this case, the memory cell is programmed and is in a logical 0 state.

The precharge and discharge times are determined by the RC time constant of the bit line and word line. The speed of the read operation is thus determined by this RC time constant.

A single level cell (SLC) non-volatile memory device has only two levels of threshold voltages to be programmed: a programmed state (i.e. logical 0) and an erased state (i.e., logical 1). A two bit multilevel cell (MLC) non-volatile memory device has four levels of threshold voltages: a logical 11 for an erased state and logical 00, 01, 10 for programmed states. The state of the MLC cell is determined using multiple SLC-like read operations to determine to which of the four levels of threshold voltages the cell being read belongs.

MLC devices can also have more than two bits of data stored requiring more than four different threshold voltage levels. As the number of levels stored on a cell increases, the number of read operations necessary to determine the data stored also increases. Increasing the number of read operations thus increases the overall read time for each cell and decreases the memory's performance. As the performance of computer systems increases, the memory manufacturers are under pressure to increase their memory performance as well in order to keep pace.

For the reasons stated above, and for other reasons stated below that will become apparent to those skilled in the art upon reading and understanding the present specification, there is a need in the art to increase memory read operation performance.

DETAILED DESCRIPTION

Figure 1:
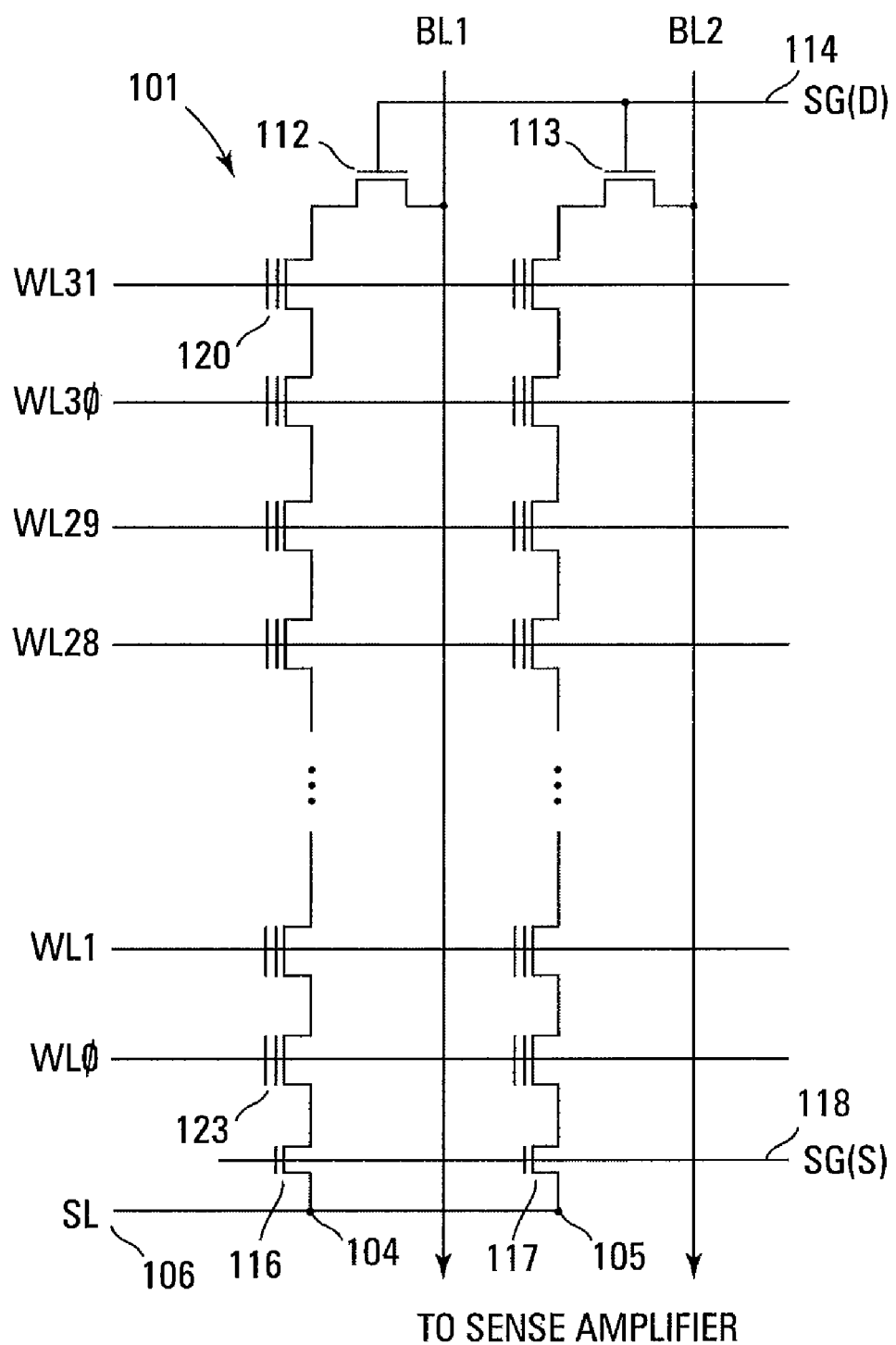
FIG. 1 shows schematic diagram of one embodiment of series NAND strings of memory cells.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a schematic diagram of a portion of a NAND architecture memory array 101 comprising series strings of non-volatile memory cells on which one embodiment of the method for erasing can be used. While FIG. 1 and the subsequent discussions refer to a NAND memory device, the present embodiments are not limited to such an architecture but can be used in other memory device architectures as well.

The memory array is comprised of an array of non-volatile memory cells 101 (e.g., floating gate) arranged in columns such as series strings 104, 105. Each of the cells 101 are coupled drain to source in each series string 104, 105. An access line (e.g. word line) WL0-WL31 that spans across multiple series strings 104, 105 is connected to the control gates of each memory cell in a row in order to bias the control gates of the memory cells in the row. The data lines (e.g., bit lines) BL1, BL2 are eventually connected to sense amplifier circuits (not shown) that detect the state of each cell by sensing current on a particular bit line.

Each series string 104, 105 of memory cells is coupled to a source line 106 by a source select gate 116, 117 and to an individual bit line BL1, BL2 by a drain select gate 112, 113. The source select gates 116, 117 are controlled by a source select gate control line SG(S) 118 coupled to their control gates. The drain select gates 112, 113 are controlled by a drain select gate control line SG(D) 114.

Figure 2:
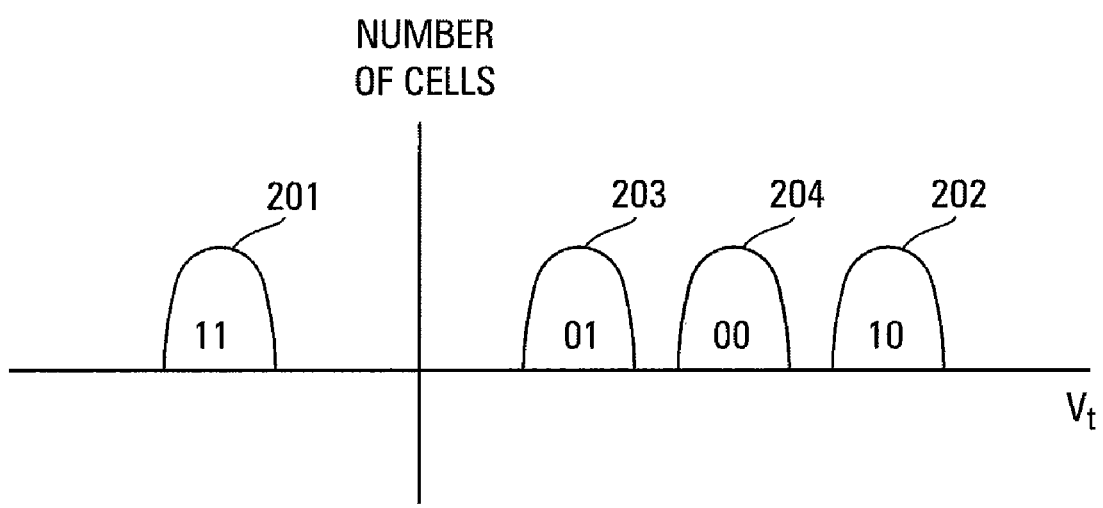
FIG. 2 shows one embodiment of a $V_t$ distribution in accordance with the memory cells of FIG. 1.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. As illustrated in FIG. 2, the MLC may have multiple $V_t$ voltage ranges that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

The sensing method of the present disclosure biases, with a ramped voltage, the control gates of memory cells coupled to a selected word line WL0-WL31 of the memory block being read. In one embodiment, the selected word line ramped voltage can be in the range of 0V to 3.5V. Alternate embodiments may use other start and stop voltages. The embodiments of the sensing method are described subsequently with reference to the timing diagrams of FIGS. 3-6 and the circuit of FIG. 7.

FIG. 2 illustrates one embodiment of memory cell threshold voltage ($V_t$) distributions for a multiple bit (MLC) memory device. This figure shows that the logical 11 state 201 is the most negative state and is typically referred to as the erased state. The logical 10 state 202 is the most positive state. The logical 01 state 203 and the logical 00 state 204 are located between the most negative and most positive states 201, 202. The logical states assigned to each distribution are for purposes of illustration only. Alternate embodiments can have other logical states assigned to each distribution as well as different quantities of distributions, depending on the programmable density of the memory cells.

As a result of a program operation, a memory cell's threshold voltage is moved from the erased state 201 to one of the programmed states 202-204. For example, if a non-volatile memory cell is programmed to the logical 01 state 203, the program operation would move the memory cell's threshold voltage from the logical 11 state 201 to the logical 01 state 203. During a program verify operation, a voltage in the logical 01 state voltage range 203 should be sensed with the sense circuits for a successful program operation.

A single bit memory device would have only two threshold voltage distributions. One distribution is the negative threshold distribution and represents the logical "1" state for erased memory cells. The second distribution is the positive, programmed state that is represented by a logical "0".

During a program operation as shown in FIG. 2, a program verify operation is performed after each program pulse in order to determine if the memory cell has reached the target threshold voltage. The program verify is comprised of a sense operation and a read operation. In a typical prior art MLC memory device, multiple verify operations are necessary after each program pulse in order to determine the state of the cell.

Figure 3:
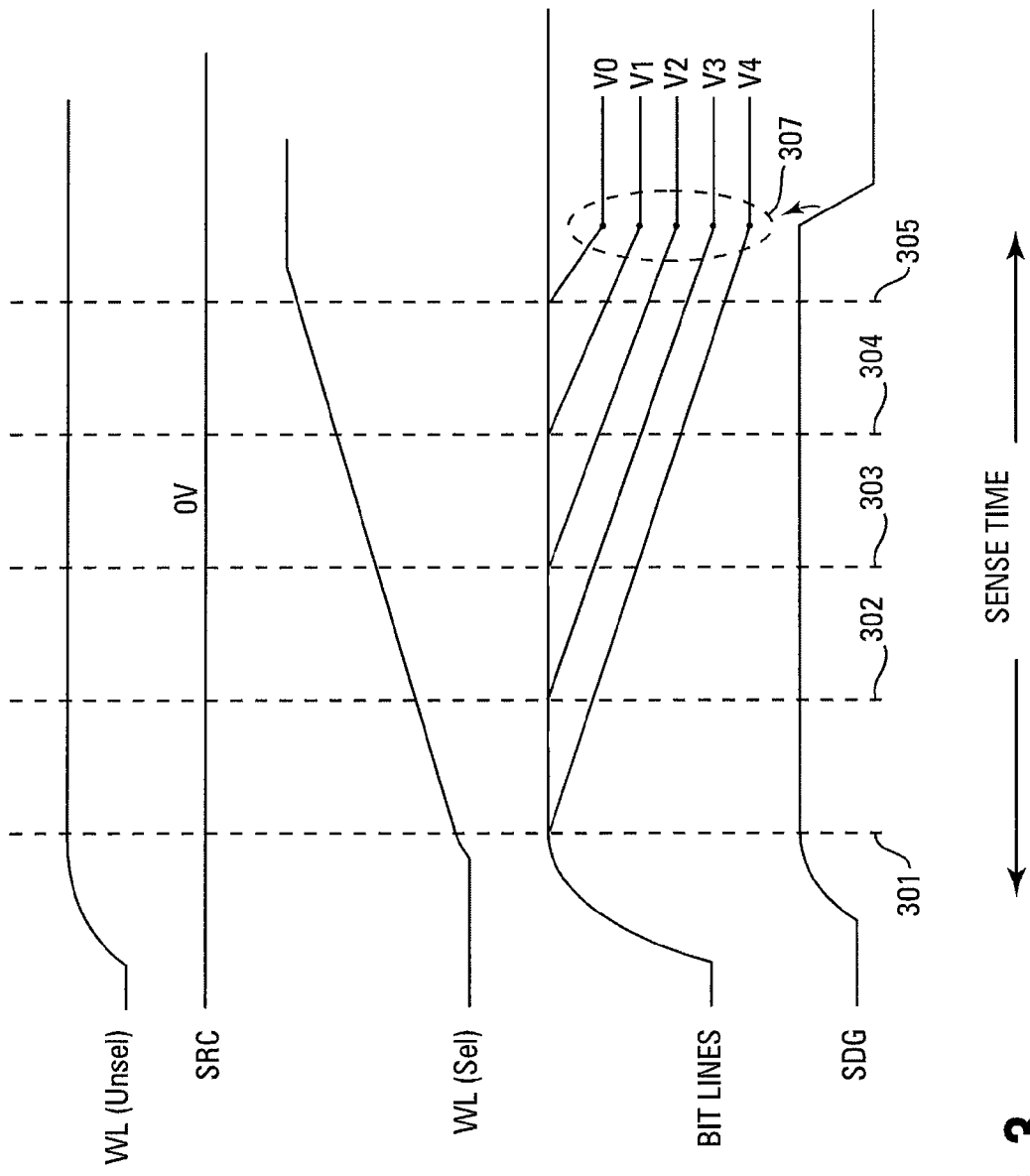
FIG. 3 shows a timing diagram of signals of one embodiment of a method for sensing for MLC read and program verify operations.
Figure 4:
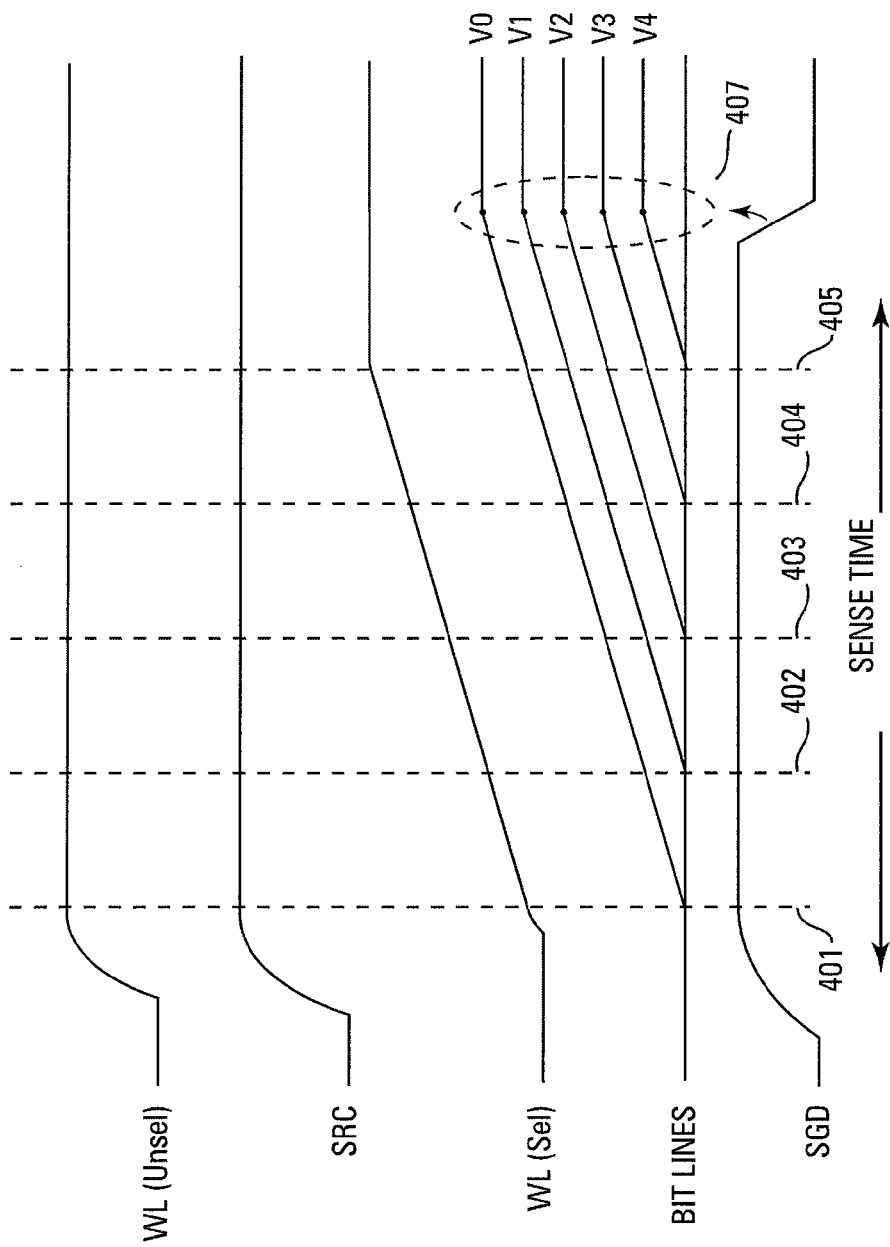
FIG. 4 shows a timing diagram of signals of an alternate embodiment of a method for sensing for MLC read and program verify operations.
Figure 5:
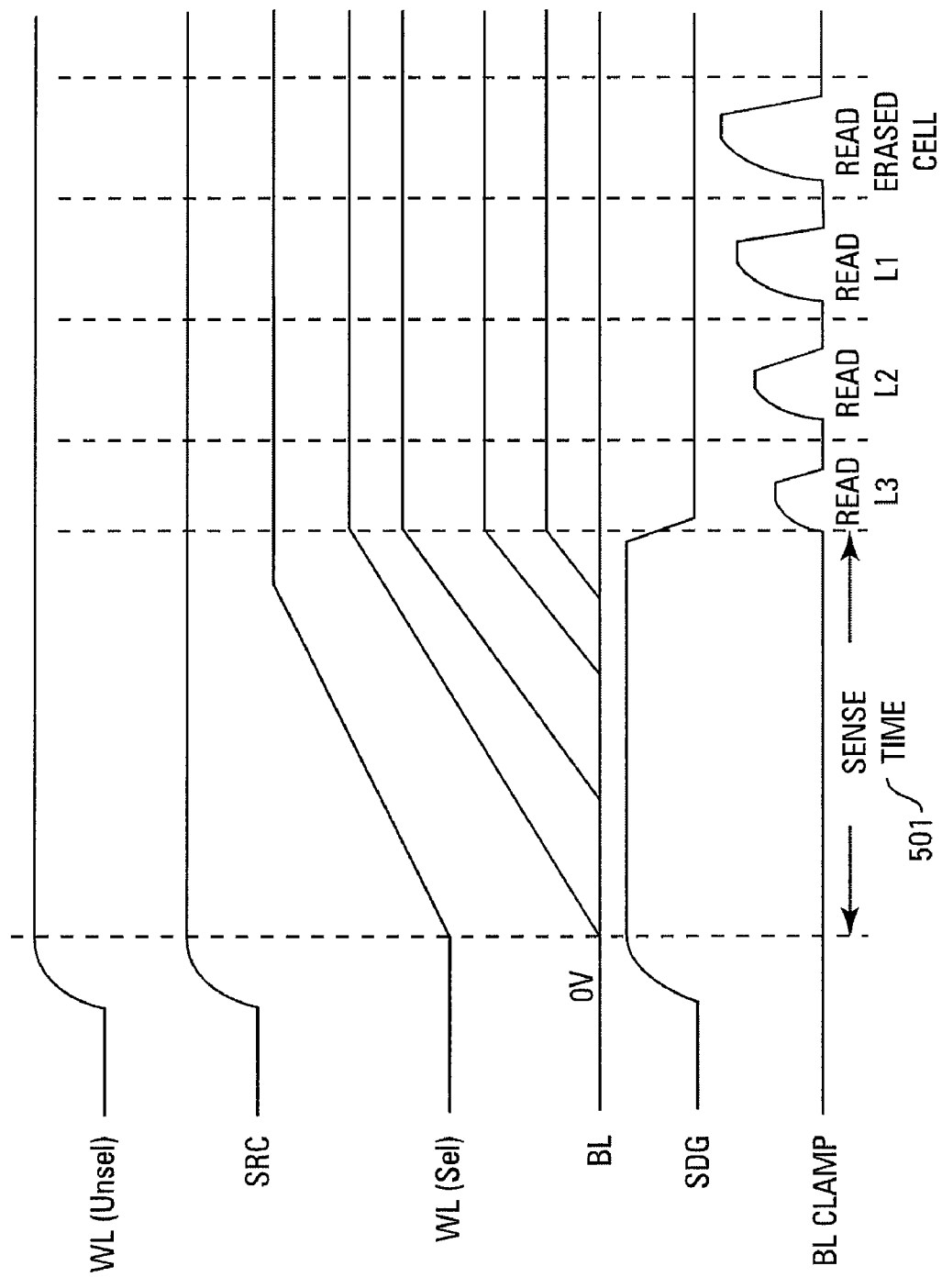
FIG. 5 shows a timing diagram of signals for one embodiment of a method for reading different levels of MLC memory.
Figure 6:
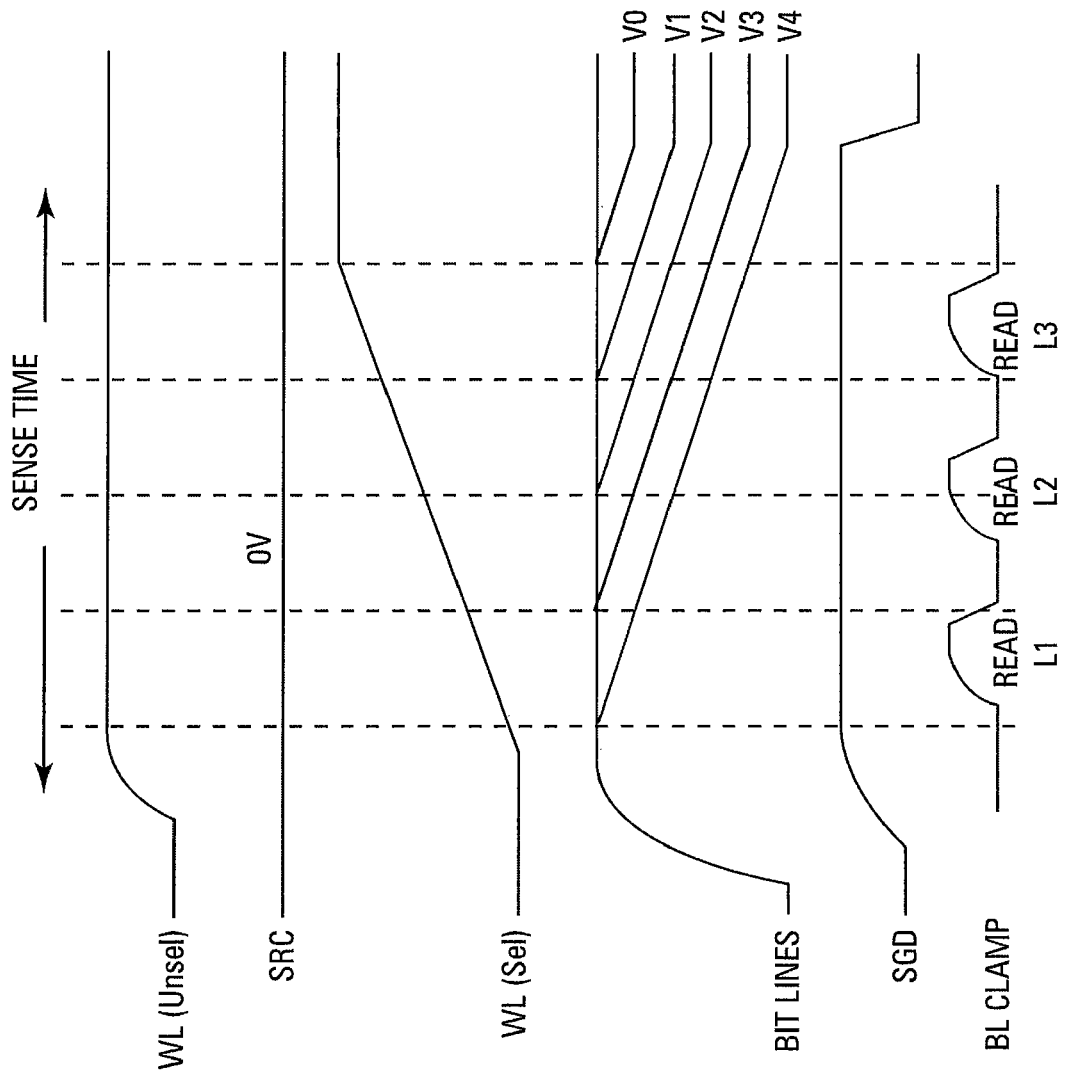
FIG. 6 shows a timing diagram of signals of another alternate embodiment of a method for sensing for MLC read and program verify operations.

FIG. 3 illustrates a timing diagram of signals of one embodiment of a method for sensing during MLC read operations, program verify operations, or any other operations requiring a sense scheme. Illustrated voltages in FIG. 3 and also in the alternate embodiments of FIGS. 4-6 are for purposes of illustration only. The present embodiments are not limited to any particular voltages.

From the top signal to the bottom signal, the timing diagram of FIG. 3 includes the biasing of the unselected word lines WL(UNSEL), the source line SRC, the selected word line WL(SEL), the bit lines, and the select gate drain control signal SGD. The memory array schematic of FIG. 1 illustrates the location of each of these signals.

The timing diagram shows that, initially during the sense operation, the unselected word lines are precharged to a $V_{pass}$ voltage (e.g., 5V-6V) and the bit lines are precharged to approximately 1.5V. In one embodiment, the pass voltage is at least 4.5V in order to allow the memory cells to pass the maximum threshold voltage. The select gate drain control signal is biased at approximately 5.0V to turn on the select gate drain transistors. The select gate drain control signal remains at 5.0V for the duration of the sense operation (e.g., 20 μs) then returns low to 0V.

Once the voltages on the source, select gate drain, bit lines, and unselected word lines are set, a ramped voltage is applied to the selected word line. In one embodiment, this ramped voltage goes from a minimum voltage of 0V to a maximum voltage of 3.5V and is a slow ramp that enables turning on the cell with a higher threshold voltage later in time in order to develop a better voltage difference from a cell with a lesser threshold voltage. Alternate embodiments can use other voltages not only for the ramped voltage but also for the other signals just described.

As the voltage of the ramped signal hits the programmed threshold voltage of each memory cell coupled to the selected word line, that memory cell turns on and discharges the bit line to which it is coupled. This process is shown by the bit line signals of FIG. 3 and the vertical dashed lines 301-305 that represent a threshold voltage V0-V4 at which each memory cell turns on.

For example, the ramped word line voltage rises to a first threshold voltage 301 that results in a first memory cell turning on to cause its bit line to discharge to V4. The ramped voltage continues to a second threshold voltage 302 that turns on a second memory cell to cause its bit line to discharge to V3. The ramped voltage continues to a third threshold voltage 303 that turns on a third memory cell to cause its bit line to discharge to V2. The ramped voltage continues to a fourth threshold voltage 304 that turns on a fourth memory cell to cause its bit line to discharge to V1. Finally, the ramped voltage hits the a fifth threshold voltage 305 that turns on a fifth memory cell to cause its bit line to discharge to V0.

When the select gate drain signal of FIG. 3 goes back low, the select gate drain transistor is turned off thus turning off access of each series string of memory cells to its respective bit line. This is the point 307 at which the various threshold voltages V0-V4 are stable on their respective bit lines.

A bit line clamp control voltage (BLCLAMP) is used during a read operation to differentiate the various threshold voltage levels V0-V4 in combination with a circuit for reading the threshold voltages. The operation of the BLCLAMP voltage and its associated circuit are described subsequently in greater detail with reference to FIGS. 5 and 7, respectively.

FIG. 4 illustrates a timing diagram of signals of an alternate embodiment of a method for sensing during MLC read operations, program verify operations, or any other operations requiring a sense scheme. This timing diagram illustrates the same signals as the embodiment of FIG. 3 but biases these signals in a different way.

The unselected word lines are precharged to 6-7V. For this embodiment, the unselected word lines are precharged at least 4V higher than the source voltage in order to pass the maximum threshold voltage. The select gate drain control signal goes high to approximately 6V for the duration of the sense time (e.g., 30 μs). The source line is precharged to approximately 3V and the bit lines are initially grounded.

As the voltage on the selected word line is ramped up, the bit lines get charged up when the ramped voltage reaches the threshold voltage of the respective bit line's selected memory cell. As in the previous embodiment, the different threshold voltages V0-V4 for five different memory cells is illustrated as five vertical dashed lines 401-405. As the ramped, selected word line voltage reaches each threshold voltage 401-405, the respective memory cell turns on, conducts, and charges up its respective bit line through the source line.

As an example of operation, FIG. 4 shows that a first memory cell is turned on when the ramped word line voltage reaches a first threshold voltage 401 that causes a first bit line to charge up to V0. A second memory cell is turned on when the ramped word line voltage reaches a second threshold voltage 402 that causes a second bit line to charge up to V1. A third memory cell is turned on when the ramped word line voltage reaches a third threshold voltage 403 that causes a third bit line to charge up to V2. A fourth memory cell is turned on when the ramped word line voltage reaches a fourth threshold voltage 404 that causes a fourth bit line to charge up to V3. Finally, a fifth memory cell is turned on when the ramped word line voltage reaches a fifth threshold voltage 405 that causes a fifth bit line to charge up to V4.

When the sensing operation has been completed, the select gate drain control signal goes back low to 0V. This is the point 407 at which the various threshold voltages V0-V4 are stable on their respective bit lines.

A bit line clamp control voltage BLCLAMP is used during a read operation to differentiate the various threshold voltage levels V0-V4 in combination with a circuit for reading the threshold voltages. The operation of the BLCLAMP voltage and its associated circuit are described subsequently in greater detail with reference to FIGS. 5 and 7, respectively.

FIG. 5 illustrates a timing diagram of one embodiment of a method for reading the different voltage levels of an MLC memory as generated by the embodiments of FIGS. 3 and 4. The sensing time 501 portion of the timing diagram can encompass either the embodiment of FIG. 3 or the embodiment of FIG. 4. Thus the reading operation illustrated in FIG. 5 occurs after one of these sensing operations. The timing diagram of FIG. 5 is subsequently discussed in parallel with the read circuit of FIG. 7.

Figure 7:
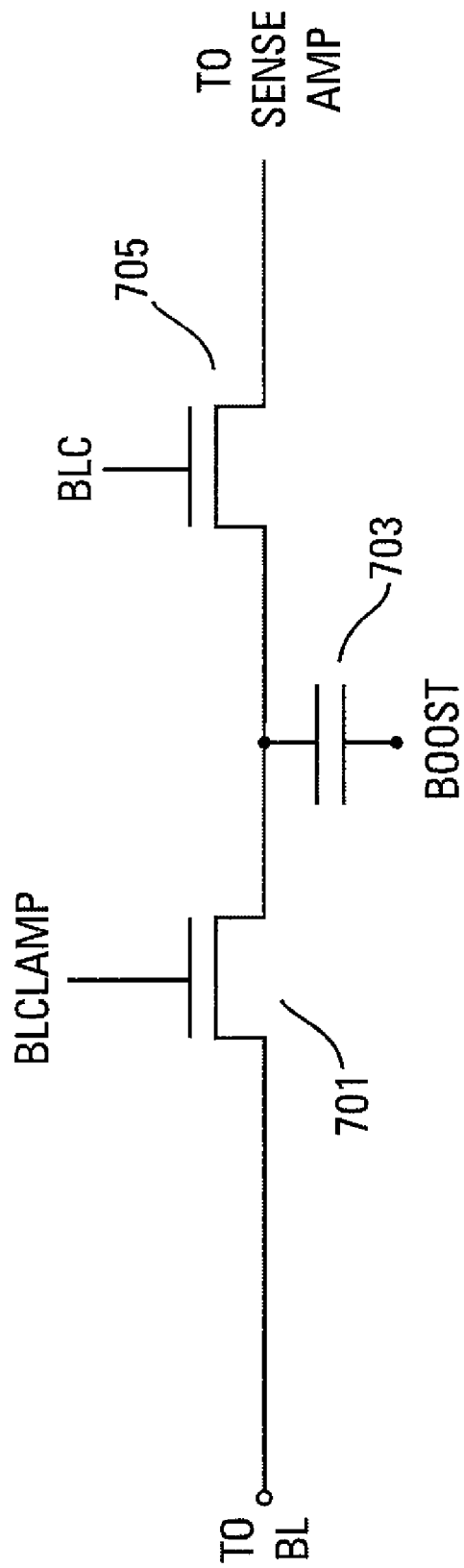
FIG. 7 shows a circuit used for reading MLC memory in accordance with the timing diagrams of FIGS. 5 and 6.

During the read operation, different voltage levels are applied to the BLCLAMP transistor 701 of FIG. 7 in order to discriminate between the various threshold voltage V0-V4. The larger the voltage applied to the control gate of the BLCLAMP transistor 701, the larger the voltage from the bit line that is allowed to pass through the transistor, from the bit line to the sense amplifier circuit, for reading.

In the timing diagram of FIG. 5, it can be seen that a first read pulse READ L3 follows the sense operation 501. This pulse is the lowest read pulse applied to the BLCLAMP control gate. This pulse is use to read voltage level L3 which is the lowest threshold voltage of the sensing operation.

The READ L2 pulse follows the initial pulse. The READ L2 pulse has a larger amplitude than the READ L3 pulse and thus reads a somewhat larger threshold voltage. A READ L1 follows the READ L2 pulse and is used to bias the BLCLAMP transistor in order to read the largest programmed memory cell. The final pulse shown is used to read an erased memory cell. This is the largest pulse since, in one embodiment, an erased memory cell has the largest threshold voltage of any memory cell.

The pulses shown in FIG. 5 are for purposes of illustration only. The quantity and amplitude of these pulses vanes in response to the number of threshold voltages to be read and the amplitude of the threshold voltages that are read.

Referring again to the read circuit of FIG. 7, a BOOST signal is coupled to the circuit through a capacitance 703. The BOOST signal can be used in some embodiments to increase the amplitude of the signal coming from the bit line in order for the sense amplifier circuit to read it better. This is accomplished without affecting the information contained in the signal.

A bit line control BLC transistor 705 is used by a control signal to enable and disable the read function. A logical high (e.g., 5V) on the control gate of this transistor 705 enables the signal from the bit line to be read by the sense amplifier circuit.

The read circuit of FIG. 7 is coupled to a sense amplifier circuit that performs the comparisons of the detected threshold voltage, allowed through by the BLCLAMP and BLC signals, to a reference threshold voltage. In an MLC memory device, the sense amplifier needs to perform multiple comparisons for each cell. Since each cell can store two or more bits of data, each cell can have at least four possible threshold voltage levels. The sense amplifier circuit should be able to distinguish between each different threshold voltage level.

The read circuit of FIG. 7 is for purposes of illustration only. Many different circuits can be used to enable the sense amplifier circuit to read a signal from a bit line.

FIG. 6 illustrates a timing diagram of a signals of another alternate embodiment of a method for sensing during MLC read operations, program verify operations, or any other operations requiring a sense scheme. This sensing scheme is substantially similar to the embodiment illustrated in FIG. 3 except that the reading operation is performed substantially simultaneously with the sense operation.

In the embodiment of FIG. 6, the source is grounded and the unselected word lines are precharged to approximately 5V-6V. In one embodiment, the unselected word lines are precharged to at least 4.5V in order to pass the maximum threshold voltages. The bit lines are precharged to approximately 1.5V and the select gate drain control signal is brought high (e.g., 5V) to turn on the select gate drain transistors.

As the selected word line ramped voltage increases from 0V to its maximum voltage (e.g., 3.5V), BLCLAMP pulses are generated at different times during the word line ramped voltage. The BLCLAMP pulses, in one embodiment, are applied to the same read circuit as illustrated in FIG. 7 and described previously.

The strobing of the BLCLAMP transistor 701 by the BLCLAMP pulses is used to check for turn-on of the selected memory cell by the ramped voltage. The fact that the memory cell has turned on indicates that the ramped voltage has reached the memory cell's threshold voltage. Each time the BLCLAMP transistor 701 is turned on, the sense amplifier circuit performs a comparison of the detected voltage with a reference voltage to determine the present threshold voltage of the memory cell.

Figure 8:
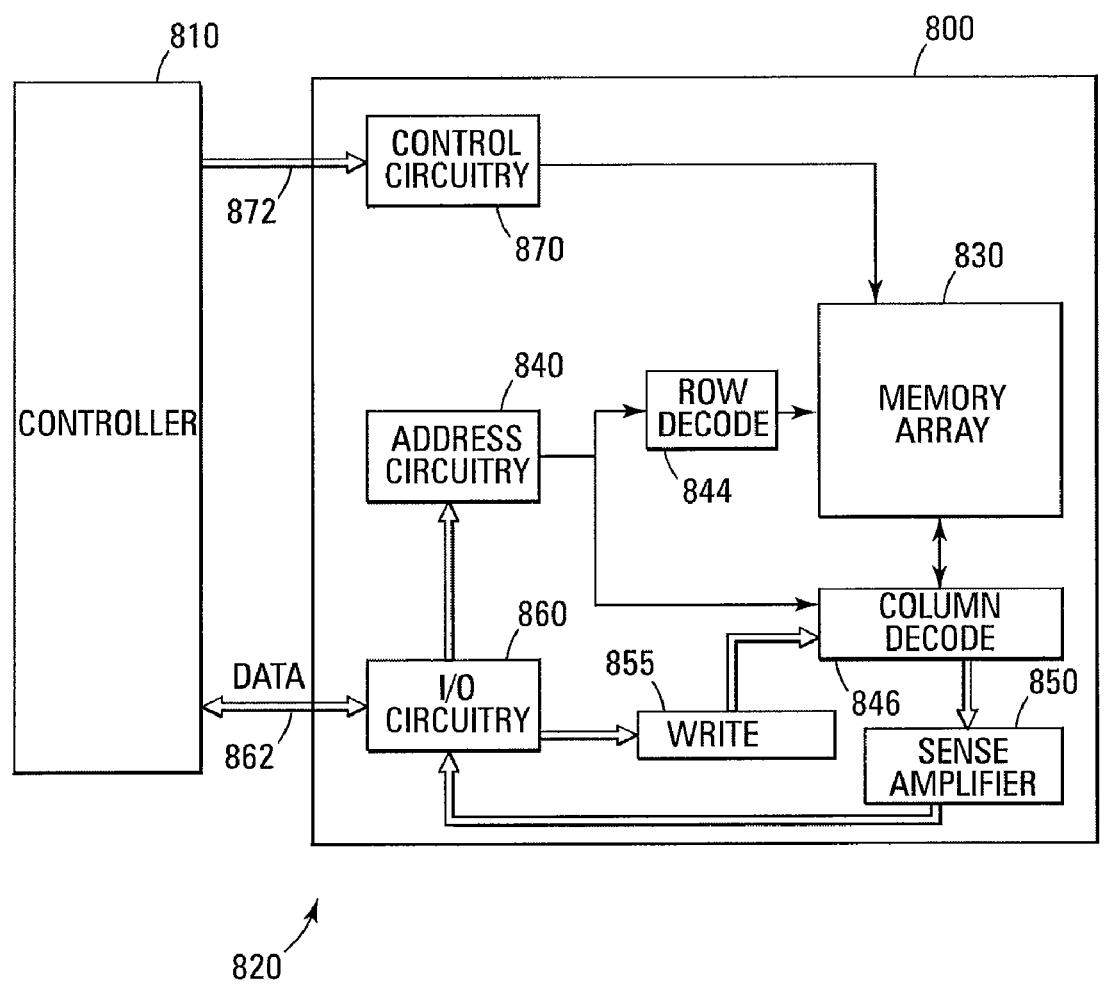
FIG. 8 shows a block diagram of one embodiment of a memory system that incorporates the present embodiments of the method for sensing.

FIG. 8 illustrates a functional block diagram of a memory device 800. The memory device 800 is coupled to an external controller 810. The controller 810 may be a microprocessor or some other type of controlling circuitry. The memory device 800 and the controller 810 form part of a memory system 820. The memory device 800 has been simplified to focus on features of the memory that are helpful in understanding the present invention.

The memory device 800 includes an array 830 of non-volatile memory cells, such as the one illustrated previously in FIG. 3. The memory array 830 is arranged in banks of word line rows and bit line columns. In one embodiment, the columns of the memory array 830 are comprised of series strings of memory cells as illustrated in FIG. 1. As is well known in the art, the connections of the cells to the bit lines determines whether the array is a NAND architecture, an AND architecture, or a NOR architecture.

Address buffer circuitry 840 is provided to latch address signals provided through the I/O circuitry 860. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense amplifier circuitry 850. The sense amplifier circuitry 850, in one embodiment, is coupled to read and latch a row of data from the memory array 830. Data input and output buffer circuitry 860 is included for bidirectional data communication as well as address communication over a, plurality of data connections 862 with the controller 810. Write circuitry 855 is provided to write data to the memory array.

Memory control circuitry 870 decodes signals provided on control connections 872 from the external controller 810. These signals are used to control the operations on the memory array 830, including data read, data write (program), and erase operations. The memory control circuitry 870 may be a state machine, a sequencer, or some other type of control circuitry to generate the memory control signals. In one embodiment, the memory control circuitry 870 is configured to execute the embodiments of the sense method of the present disclosure.

The flash memory device illustrated in FIG. 8 has been simplified to facilitate a basic understanding of the features of the memory. A more detailed understanding of internal circuitry and functions of flash memories are known to those skilled in the art.

Conclusion

In summary, one or more embodiments use a single read operation, and multiple compares, to determine which of the multiple threshold voltages to which a memory cell has been programmed. This can be accomplished by comparing the bit line voltage to a reference threshold voltage by a sense amplifier. The multiple compare operations in the sense amplifier are performed faster than the prior art charging and discharging of the selected bit line and word line.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for sensing in a memory device, the method comprising:
    precharging unselected memory cells to a pass voltage;
    precharging at least one data line to a first voltage level;
    grounding a source line; and
    applying a ramped voltage to at least one selected memory cell that turns on the at least one selected memory cell when the ramped voltage increases to a voltage level substantially equal to a threshold voltage of the at least one selected memory cell, wherein the turned on memory cell discharges the at least one data line that is coupled to the turned on memory cell.

2. The method of claim 1 and further including generating at least one read pulse after the sensing to read a voltage level.

3. The method of claim 1 wherein precharging comprises precharging an access line coupled to control gates of the unselected memory cells.

4. The method of claim 2 wherein the at least one read pulse comprises a different read pulse for each voltage level being read.

5. The method of claim 2 and further including comparing each read voltage level to a reference voltage level.

6. The method of claim 1 and further including generating at least one read pulse during the sensing to read a voltage level.

7. The method of claim 1 wherein different read pulses are generated at different times while applying the ramped voltage.

8. The method of claim 1 wherein the ramped voltage has a minimum voltage of 0V and a maximum voltage of 3.5V.

9. The method of claim 1 wherein the at least one data line is discharged from the first voltage level to a second voltage level that is indicative of the threshold voltage.

10. The method of claim 1 wherein the pass voltage is between 4.5V and 6.0V.

11. A method for sensing in a non-volatile memory device, the method comprising:
    precharging unselected memory cells to a pass voltage;
    grounding a source line;
    precharging a plurality of data lines to a first voltage level;
    turning on select gate transistors, each of which couples a respective one of a plurality of selected memory cells to a different data line; and
    applying a ramped voltage to the plurality of selected memory cells that turns on a respective one of the selected memory cell when the ramped voltage increases to a threshold voltage for that respective one of the selected memory cells wherein a turned on memory cell discharges the data line coupled to the turned on memory cell to a second voltage level that is indicative of the threshold voltage.

12. The method of claim 11 wherein the pass voltage is at a level that permits a maximum threshold voltage to pass.

13. The method of claim 11 and further including comparing the second voltage level of each data line to a reference threshold voltage level to determine a state of the turned on memory cell.

14. A method for sensing in a non-volatile memory device, the method comprising:
    precharging unselected memory cells to a pass voltage that allows a maximum threshold voltage to pass;
    precharging a source line to a voltage level;
    turning on a select gate drain transistor that couples a respective one of a plurality of selected memory cells to a different data line; and
    applying a ramped voltage to the plurality of selected memory cells that turns on each selected memory cell when the ramped voltage reaches a threshold voltage to which each selected memory cell is programmed, wherein a turned on memory cell charges its respective data line to a voltage indicative of the threshold voltage to which the selected memory cell is programmed.

15. The method of claim 14 wherein the select gate drain transistor is turned off after the sensing.

16. The method of claim 14 wherein the select gate drain transistor is turned off when the voltages on the data lines are stable.

17. The method of claim 14 and further including generating a plurality of read pulses during the sensing wherein each read pulse enables sense circuitry to sense the voltage indicative of the threshold voltage.

18. The method of claim 17 and further including the sense circuitry performing a plurality of compare operations between each sensed voltage indicative of the threshold voltage and at least one reference voltage.

19. The method of claim 14 and further including generating a plurality of read pulses after the sensing wherein each read pulse enables sense circuitry to sense the voltage indicative of the threshold voltage.

20. The method of claim 19 wherein each read pulse is comprised of a different voltage amplitude.

21. The method of claim 20 wherein each successive read pulse has a greater voltage amplitude than a previous read pulse.

22. A non-volatile memory device comprising:
a memory array comprising a plurality of memory cells coupled to word lines and bit lines, the memory array further comprising a source line; and
memory control circuitry coupled to the memory array and configured to control a sensing operation that precharges unselected word lines, grounds the source line, turns on select gate transistors, and controls the generation of a ramped voltage coupled to a selected word line wherein each selected memory cell coupled to the selected word line are turned on when the ramped voltage increases to a threshold voltage for each selected memory cell such that each turned on memory cell discharges a bit line to which it is coupled.

23. The non-volatile memory device of claim 22 wherein the device is a NAND flash memory device and the plurality of memory cells are floating gate memory cells.

24. A memory system comprising:
a controller for generating memory control signals; and
a non-volatile memory device coupled to the controller and operating in response to the memory control signals, the memory device comprising:
a memory array comprising a plurality of memory cells coupled to a source line; and
memory control circuitry coupled to the memory array for controlling operation of the memory array in response to the memory control signals, wherein the control circuitry is configured to control a sensing operation that precharges unselected memory cells, precharges the source line, turns on a select gate drain transistor to enable selected memory cell access to a data line, and controls a ramped voltage coupled to selected memory cells that turn on when the ramped voltage reaches a threshold voltage to which the selected memory cell is programmed such that the turned on memory cell charges its respective data line.

25. The non-volatile memory device of claim 24 wherein the plurality of memory cells are coupled to word lines in rows and bit lines in columns wherein the columns of memory cells are comprised of a NAND series string of memory cells.

26. The non-volatile memory device of claim 24 wherein the memory control signals comprise program and erase control signals.

27. A method for sensing in a memory device, the method comprising:
precharging unselected memory cells to a pass voltage;
grounding at least one data line;
precharging a source line to a voltage level; and
applying a ramp voltage to at least one selected memory cell that turns on the at least one selected memory cell when the ramped voltage increases to a voltage level substantially equal to a threshold voltage of the at least one selected memory cell, wherein the turned on memory cell charges the at least one data line that is coupled to the turned on memory cell.

28. The method of claim 27 wherein the pass voltage is at least 4V greater than the source line voltage level.

29. A non-volatile memory device comprising:
a memory array comprising a plurality of memory cells coupled to word lines and bit lines, the memory array further comprising a source line; and
memory control circuitry coupled to the memory array and configured to control a sensing operation that precharges unselected word lines, grounds the source line, turns on select gate transistors, and controls the generation of a ramped voltage coupled to a selected word line wherein each selected memory cell coupled to the selected word line are turned on when the ramped voltage increases to a threshold voltage for each selected memory cell such that each turned on memory cell charges a bit line to which it is coupled.

30. The memory device of claim 29 and further comprising a read circuit coupled between each bit line and a sense amplifier circuit.

31. The memory device of claim 30 wherein the read circuit is comprised of a bit line control transistor and a boost signal circuit that increases an amplitude of a signal from the bit line.

* * * * *